(12) United States Patent
Kim et al.

(10) Patent No.: US 8,094,280 B2
(45) Date of Patent: Jan. 10, 2012

(54) ARRAY SUBSTRATE, LIQUID CRYSTAL DISPLAY DEVICE HAVING THE SAME, AND MANUFACTURING METHOD THEREOF

(75) Inventors: Jin Wuk Kim, Gyeonggi-do (KR); Sang Yeup Lee, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 92 days.

(21) Appl. No.: 12/795,113

(22) Filed: Jun. 7, 2010

(65) Prior Publication Data

US 2010/0238392 A1    Sep. 23, 2010

Related U.S. Application Data

(62) Division of application No. 11/802,537, filed on May 23, 2007, now Pat. No. 7,746,444.

(30) Foreign Application Priority Data

Jun. 26, 2006 (KR) ............................... 2006/057373
Apr. 26, 2007 (KR) ............................... 2007/0041023

(51) Int. Cl.
*G02F 1/136* (2006.01)
*G02F 1/1343* (2006.01)
*G02F 1/13* (2006.01)

(52) U.S. Cl. ........................... 349/140; 349/43; 349/187
(58) Field of Classification Search .................... 349/42, 349/43, 140, 187–192
See application file for complete search history.

(56) References Cited

U.S. PATENT DOCUMENTS

| 7,961,284 B2 * | 6/2011 | Chang et al. ............... 349/141 |
| 2005/0142714 A1 | 6/2005 | Chae et al. |
| 2005/0253978 A1 | 11/2005 | Chae et al. |
| 2008/0227244 A1 * | 9/2008 | Kim ............................. 438/160 |
| 2008/0246906 A1 | 10/2008 | Kim et al. |

FOREIGN PATENT DOCUMENTS

| JP | 01-297624 | 11/1989 |
| JP | 08-069238 | 3/1994 |
| JP | 10-301505 | 11/1998 |
| JP | 2005-197699 | 7/2005 |

\* cited by examiner

*Primary Examiner* — Kevin S Wood
(74) *Attorney, Agent, or Firm* — Morgan, Lewis & Bockius LLP

(57) ABSTRACT

An array substrate includes a gate line disposed along a first direction on a substrate; a gate electrode extending from the gate line; a gate insulating layer over the substrate, including the gate line; a first plane layer on first portions of the gate insulating layer; a semiconductor layer on second portions of the gate insulating layer and on the first plane layer; a second plane layer over the first plane layer; a data line; a source electrode and a drain electrode on the semiconductor layer and on the second plane layer, the source electrode extending from the data line; a passivation layer on the second plane layer, the source electrode, the drain electrode and the semiconductor layer; and a pixel electrode on the passivation layer, the pixel electrode electrically connected to the drain electrode via a first contact hole.

14 Claims, 21 Drawing Sheets

ARRAY SUBSTRATE, LIQUID CRYSTAL DISPLAY DEVICE HAVING THE SAME, AND MANUFACTURING METHOD THEREOF

This is a divisional of U.S. application Ser. No. 11/802,537, now U.S. Pat. No. 7,746,444, filed May 23, 2007, which is hereby incorporated by reference. This application also claims the benefit of Korean Patent Application No. 10-2006-0057373 filed in Korea on Jun. 26, 2006, which is hereby incorporated by reference.

BACKGROUND OF THE INVENTION

1. Field of the Invention

The present invention relates to a liquid crystal display (LCD) device, and more particularly, to an array substrate having high resolution patterns, an LCD device having the same, and a manufacturing method thereof.

2. Description of the Related Art

Recently, an interest regarding patterning technology for manufacturing a semiconductor device and a display device has increased. Patterning technology has a great influence on miniaturization, high integration, and production of a semiconductor device and a display device. That is, as the patterning technology becomes complicated, production decreases and error rate may increase. Photolithography using a photoresist resin reacting to light has been widely used as the related art patterning technology.

FIGS. 1A to 1E are cross-sectional views explaining a method for forming metal patterns using the related art photolithography. As illustrated in FIG. 1A, a metal film 20a is formed by depositing metal on a substrate 10. Subsequently, a photoresist resin is formed on the metal film 20a to form a photoresist film 90.

As illustrated in FIG. 1B, after a mask M is disposed over the photoresist film 90, UV light is illuminated thereon.

As illustrated in FIG. 1C, a hardening region 90a is formed from the photoresist film 90 onto which light that has passed through the mask M is illuminated. The substrate 10 is developed, and the photoresist film 90 except the hardening region 90a is removed. Therefore, photoresist patterns having the hardening region 90a are formed.

As illustrated in FIG. 1D, etching is performed using the photoresist patterns as a mask.

As illustrated in FIG. 1E, metal patterns 20 are formed on the substrate 10 by stripping the photoresist patterns.

Because the related art photolithography requires five processes of a depositing process, an exposure process, a developing process, an etching process, and a stripping process in order to form one metal pattern, the entire process is complicated. Also, the related art photolithography requires an exposure equipment having a light source for illuminating light. However, such exposure equipment is considerably expensive. In the case where patterns are formed using this expensive exposure equipment, process costs increase. Further, the related art photolithography forms photoresist patterns using light. However, light can be diffracted due to limit of the exposure equipment, which can make the photoresist patterns imprecise. Accordingly, metal patterns formed using such photoresist patterns can also be imprecise such that high resolution patterns cannot be obtained. Yield considerably decreases due to such imprecise patterns.

SUMMARY OF THE INVENTION

Accordingly, embodiments of the present invention are directed to an array substrate, a manufacturing method thereof, and an LCD device having the same that substantially obviate one or more problems due to limitations and disadvantages of the related art.

An object of embodiments of the invention is to provide an array substrate having high resolution patterns, a manufacturing method thereof, and an LCD device having the same, capable of simply forming fine patterns at low costs by performing patterning using a non-exposure process.

Additional features and advantages of embodiments of the invention will be set forth in the description which follows, and in part will be apparent from the description, or may be learned by practice of embodiments of the invention. The objectives and other advantages of the embodiments of the invention will be realized and attained by the structure particularly pointed out in the written description and claims hereof as well as the appended drawings.

To achieve these and other advantages and in accordance with the purpose of embodiments of the invention, as embodied and broadly described, an array substrate includes a gate line disposed along a first direction on a substrate, a gate electrode extending from the gate line, a gate insulating layer over the substrate, including the gate line, a first plane layer on first portions of the gate insulating layer, a semiconductor layer on second portions of the gate insulating layer and on the first plane layer, a second plane layer over the first plane layer, a data line, a source electrode and a drain electrode on the semiconductor layer and on the second plane layer, the source electrode extending from the data line, a passivation layer on the second plane layer, the source electrode, the drain electrode and the semiconductor layer, and a pixel electrode on the passivation layer, the pixel electrode electrically connected to the drain electrode via a first contact hole.

In another aspect, A liquid crystal display device includes a color filter substrate, an array substrate including: a gate line disposed along a first direction on a substrate, a gate electrode extending from the gate line, a gate insulating layer over the substrate, including the gate line, a first plane layer on first portions of the gate insulating layer, a semiconductor layer on second portions of the gate insulating layer and on the first plane layer, a second plane layer over the first plane layer, a data line, a source electrode and a drain electrode on the semiconductor layer and on the second plane layer, the source electrode extending from the data line, a passivation layer on the second plane layer, the source electrode, the drain electrode and the semiconductor layer, and a pixel electrode on the passivation layer, the pixel electrode electrically connected to the drain electrode via a first contact hole, and a liquid crystal layer between the color filter substrate and the array substrate.

In another aspect, a method for manufacturing an array substrate, the method includes forming a gate line and a gate electrode on a substrate using a first mold, forming a gate insulating layer over the substrate including the gate line and the gate electrode, forming a first plane layer on first portions of the gate insulating layer, forming a semiconductor layer on second portions of the gate insulating layer using a second mold, forming a second plane layer over the first plane layer, forming a data line on the second plane layer and a source electrode and a drain electrode on the semiconductor layer using a third mold, forming a passivation layer having a contact hole using a fourth mold, and forming a pixel electrode on the passivation layer using a fifth mold, the pixel electrode electrically connected to the drain electrode via the contact hole.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIGS. 3A to 19A are cross-sectional views illustrating a process of manufacturing an array substrate according to an embodiment of the invention;

FIGS. 3B to 19B are plan view of FIGS. 3A to 19A, respectively, and

DETAILED DESCRIPTION OF THE PREFERRED EMBODIMENTS

Reference will now be made in detail to the preferred embodiments of the invention, examples of which are illustrated in the accompanying drawings.

An array substrate for a liquid crystal display device according to an embodiment of the invention can be manufactured using in-plane printing (IPP). Unlike the related art photolithography, the IPP forms patterns using a non-exposure process that does not use light. For example, a metal film is formed on the substrate, and an etching resist film is formed on the metal film. After that, a mold patterned to have embossed portions and recesses (unevenness) contacts the etching resin film. With this structure, unevenness patterns of the mold are transferred to the etching resist film by repulsive force due to a difference in surface energy between the etching resist film and the mold and capillary force by which the etching resist film is sucked into the recess patterns of the mold. That is, etching resist patterns corresponding to the recess patterns of the mold can be formed.

When the IPP is used, processing can be simplified and costs can be decreased. Since the unevenness patterns of the mold are directly transferred to the substrate, patterns of high resolution can be formed and yield can be improved. An array substrate manufactured by the IPP will be described below. Although an in-plane switching (IPS) mode array substrate is described below as an example of an array substrate using the IPP, embodiments of the invention are not limited thereto but can be readily applied to an array substrate of various modes including a twisted nematic (TN) mode. Also, embodiments of the invention are not limited to an array substrate. A color filter substrate can be manufactured using the IPP.

Figure 1A:
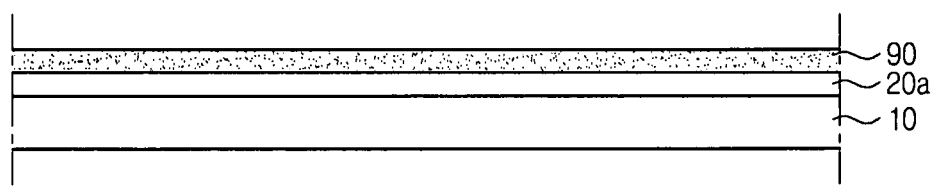
FIGS. 1A to 1E are cross-sectional views explaining a method for forming metal patterns using related art photolithography.
Figure 1B:
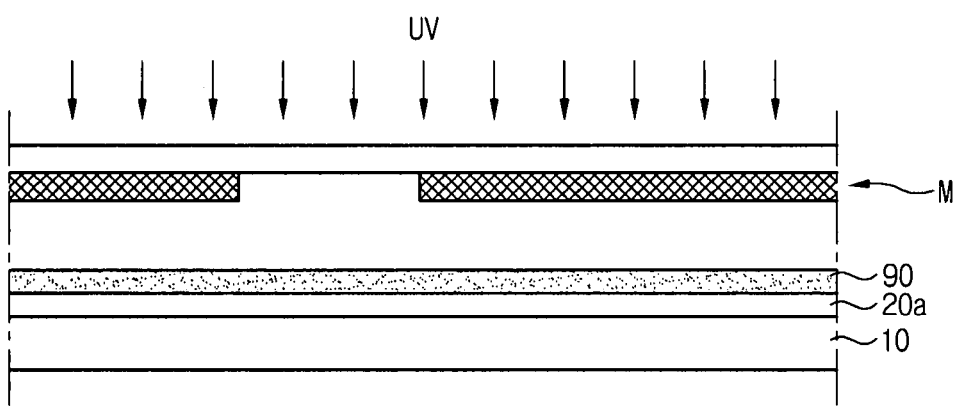
Figure 1C:
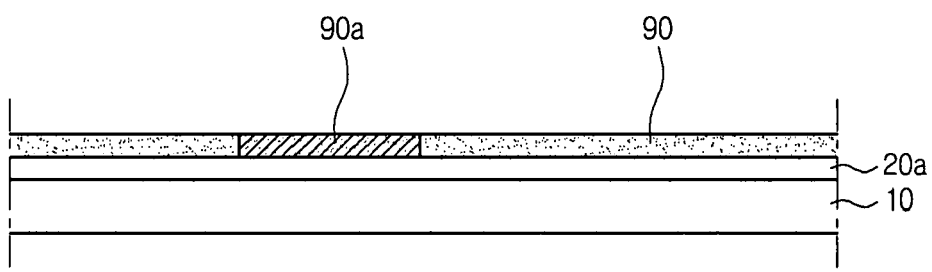
Figure 1D:
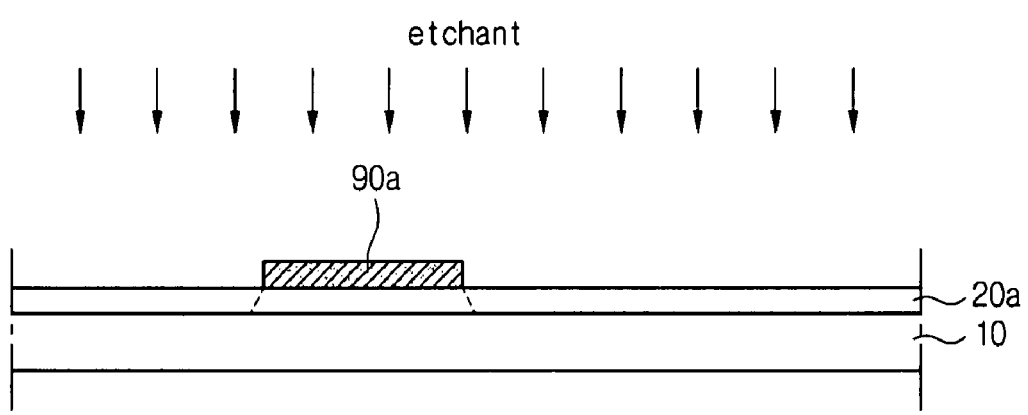
Figure 1E:
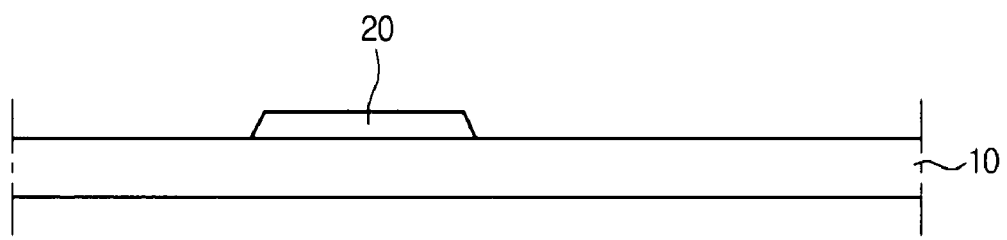
Figure 2A:
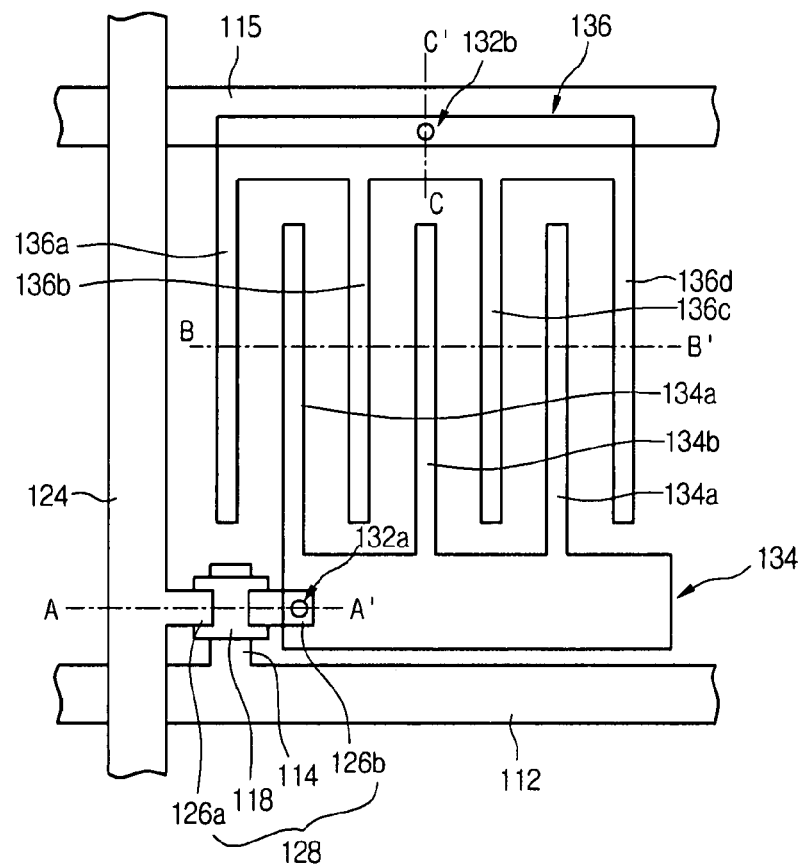
FIG. 2A is a plan view illustrating an array substrate according to an embodiment of the invention.
Figure 2B:
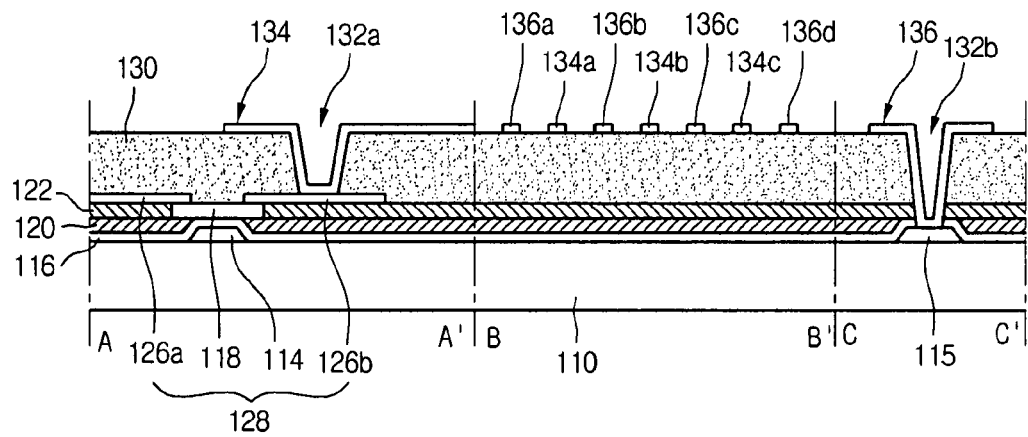
FIG. 2B is a cross-sectional view taken along lines A-A', B-B', and C-C' of FIG. 2A.

FIG. 2A is a plan view illustrating an array substrate according to an embodiment of the invention, and FIG. 2B is a cross-sectional view taken along lines A-A', B-B', and C-C' of FIG. 2A. Referring to FIGS. 2A and 2B, a gate line 112 is disposed along a first direction on a substrate 110, and a gate electrode 114 extending from the gate line 112 is also disposed on the substrate 110. A common line 115 is disposed in parallel to the gate line 112. The common line 115 and the gate line 112 can be disposed on the same plane.

The gate line 112, the gate electrode 114, and the common line 115 can be simultaneously formed using one IPP process. A gate insulating layer 116 is formed on the substrate 110, including the gate line 112. The gate insulating layer 116 can be formed of an inorganic insulating material, such as SiN, or an organic insulating material, such as benzocyclobutene (BCB).

A pattern forming material should be disposed on the substrate 110 that is planar to form the uniform patterns using one IPP process. This is because a mold used for the IPP is for planar surfaces to uniformly and consistently yield a desired pattern. The gate insulating layer 116 has height difference caused by the gate line 112, the gate electrode 114, and the common line 115. This height difference can cause non-uniform or non-planar surface.

To create a planar surface, a first plane layer 120 is disposed on lower portions of the gate insulating layer 116 that excludes higher portions of the gate insulating layer 116 corresponding to the gate line 112, the gate electrode 114, and the common line 115. The first plane layer 120 can be formed of the same material as the gate insulating layer 116 or material different from that of the gate insulating layer 116. An upper surface of the first plane layer 120 is disposed to coincide with upper surfaces of the higher portions of the gate insulating layer 116 corresponding to the gate line 112, the gate electrode 114, and the common line 115. Therefore, a planar surface is obtained at the upper surfaces of the first plane layer 120 and the higher portions of the gate insulating layer 116 that corresponds to the gate line 112, the gate electrode 114, and the common line 115.

Then, a semiconductor layer 118, including an active layer and an ohmic contact layer, is disposed on a portion of the gate insulating layer 116 that corresponds to the gate electrode 114 on the substrate 110, including the first plane layer 120. Since the semiconductor layer 118 is formed on the higher portions of the gate insulating layer 116 and overlaps onto upper surfaces of the first plane layer 120, a height difference is generated between where the semiconductor layer 118 has been formed on the first plane layer 120 and other regions of the first plane layer 120 where the semiconductor layer 118 has not been formed. Therefore, a second plane layer 122 is disposed on a portion of the first plane layer 120 around the semiconductor layer 118. The upper surface of the second plane layer 122 is disposed to coincide with the upper surface of the semiconductor layer 118. Therefore, a planar surface is obtained by the semiconductor layer 118 and the second plane layer 122.

The second plane layer 122 can be formed of the same material as or different material from that of the gate insulating layer 116. The second plane layer 122 can be formed of an inorganic insulating material, such as SiN, or an organic insulating material, such as BCB.

A data line 124 is disposed on the substrate 110, including the second plane layer 122. A source electrode 126a extends from the data line 124. A drain electrode 126b is disposed apart from the source electrode 126a. The data line 124 can be disposed along a second direction crossing the gate line 112. A pixel region can be defined by crossing of the gate line 112 and the data line 124. The data line 124, the source electrode 126a, and the drain electrode 126b can be simultaneously formed using one IPP process. By doing so, a thin film transistor 128 including the gate electrode 114, the semiconductor layer 118, the source electrode 126a, and the drain electrode 126b can be formed.

A passivation layer 130 is disposed on the substrate 110 including the data line 124. The passivation layer 130 can be formed of an inorganic insulating material, such as SiN, or an organic insulating material, such as BCB. Since the passivation layer 130 is generally formed very thick compared to the data line 124, the source electrode 126a, and the drain electrode 126b, the passivation layer 130 does not have a height difference caused by the data line 124, the source electrode 126a, and the drain electrode 126b. Therefore, no plane layer is required to be formed on the passivation layer 130 corresponding to the data line 124, the source electrode 126a, and the drain electrode 126b.

A first contact hole 132a exposing the drain electrode 126b, and a second contact hole 132b exposing the common line 115 can be formed in the passivation layer 130 using one IPP process. A pixel electrode 134 is disposed to electrically connect to the drain electrode 126a via the first contact hole 132a. A plurality of pixel electrode bars 134a, 134b, and 134c extend from the pixel electrode 134. Also, a common electrode 136 is disposed to electrically connect to the common line 115 via the second contact hole 132b. A plurality of common electrode bars 136a, 136b, 136c, and 136d extend from the common electrode 136. The pixel electrode bars 134a, 134b, and 134c, and the common electrode bars 136a, 136b, 136c, and 136d can be alternately arranged. The pixel electrode 134, the pixel electrode bars 134a, 134b, and 134c, the common electrode 136, and the common electrode bars 136a, 136b, 136c, and 136d can be simultaneously formed using one IPP process.

In the above description, the common electrode 136 and the common electrode bars 136a, 136b, 136c, and 136d can be simultaneously formed on the same plane together with the pixel electrode 134 and the pixel electrode bars 134a, 134b, and 134c. However, the common electrode 136, the common electrode bars 136a, 136b, 136c, and 136d may be formed in a different layer from that of the pixel electrode 134, and the pixel electrode bars 134a, 134b, and 134c for the IPS mode array substrate embodiment of the invention. For example, the common electrode can be integrally formed with the common line 115, and the common electrode bars extending from the common electrode can be simultaneously formed when the common line 115 is formed. In this case, only the pixel electrode 134 and the pixel electrode bars 134a, 134b, and 134c are disposed on the passivation layer 130.

When an array substrate is manufactured using the IPP, not the photolithography, a process is simplified and exposure equipment is not used. Thus, process costs are considerably reduced. Also, since patterns are directly transferred to a substrate using a mold, high resolution patterns can be obtained, and yield can be increased.

FIGS. 3A to 19B are views explaining a process of manufacturing an array substrate according to an embodiment of the invention. According to embodiments of the present invention, an array substrate is manufactured using the IPP that can form patterns using a non-exposure process. In the IPP, desired patterns are formed by moving a pattern material to recess patterns of a mold using repulsive force due to contacting the mold and capillary force.

Figure 3A:
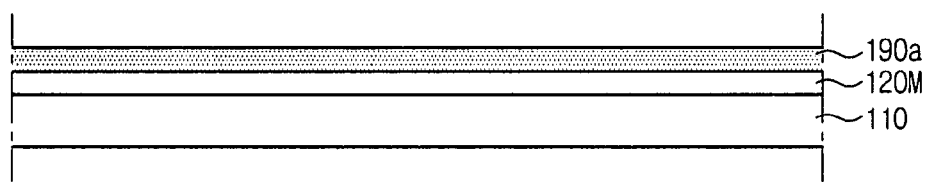
Figure 3B:

Referring to FIGS. 3A and 3B, a first metal film 111 is deposited on the entire surface of the substrate 110. The first metal film 111 can be formed of metal having conductivity. The first metal film 111 can be deposited using sputtering or chemical vapor deposition (CVD).

An etching resist (ER) material is coated on the first metal film 111 to form a first ER layer 190a. The first ER layer 190a serves as a mask for forming patterns, and can be formed from one of a group including polyethylene glycol, hexandiol diacylate, and 1,4-butanediol diglycidyl ether. A surface energy of the first ER layer 190a is about 33 mJ/cm2 to 40 mJ/cm2.

Figure 4A:
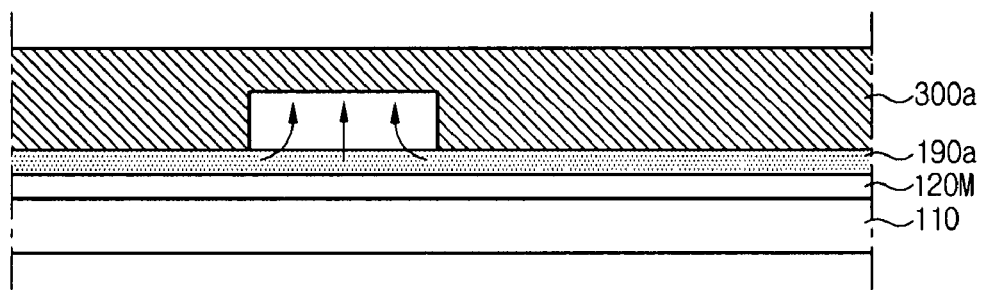
Figure 4B:
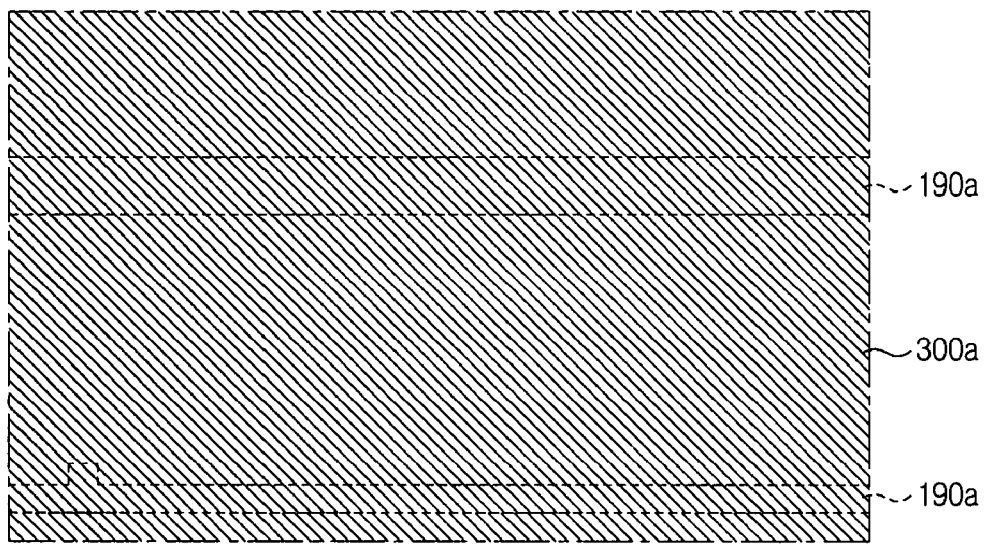

Referring to FIGS. 4A and 4B, a first mold 300a having embossed/recess patterns (unevenness) is positioned on the first ER layer 190a. The first mold 300a can be formed of polydimethylsiloxane (PDMS) having a surface energy of about 20 mJ/cm$^2$. Therefore, a difference of the surface energy between the first mold 300a and the first ER layer 190a is about 13-20 mJ/cm$^2$. Therefore, when the first mold 300a contacts the first ER layer 190a, the first ER layer 190a has repulsive force to the first mold 300a. Also, when the first mold 300a contacts the first ER layer 190a, capillary force by which a portion of the first ER layer 190a that corresponds to the embossed patterns of the first mold 300a is moved to the recess patterns of the first mold 300a, is created. Since the capillary force is greatly influenced by the width or thickness of the recess patterns of the first mold 300a, or the thickness of the first ER layer 190a, it is required to optimize the width or thickness of the first mold 300a, or the thickness of the first ER layer 190a by carrying out a test in advance.

A material for the first mold 360a can be an elastic material having low surface free energy and strong durability so that it is easily formed and adhesion is not generated when other polymer is molded. The material for the first mold 300a may be PDMS, for example.

The first mold 300a can be manufactured from a master mold. For example, a resist pattern having predetermined patterns is formed on the master mold. A mold material, such as PDMS, is formed on the resist pattern. After the PDMS is hardened, the first mold 300a can be manufactured by separating the hardened PDMS from the master mold.

Figure 5A:
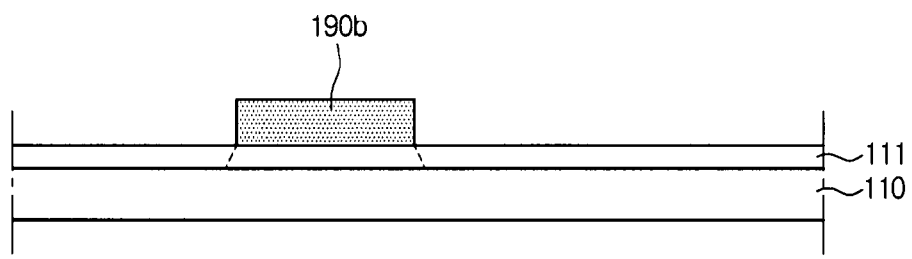
Figure 5B:
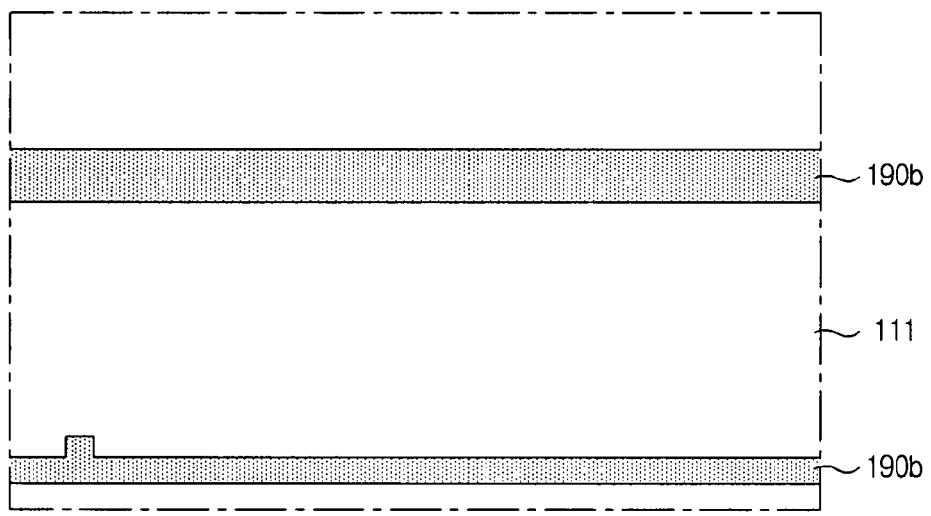

When the first mold 300a contacts the first ER layer 190a, a portion of the first ER layer 190a that corresponds to the embossed patterns of the first mold 300a is moved to the recess patterns of the first mold 300a by capillary force and repulsive force between the first mold 300a and the first ER layer 190a. Therefore, the portion of the first ER layer 190a that corresponds to the embossed patterns of the first mold 300a is completely moved to the recess patterns of the first mold 300a, so that the lower surface of the embossed patterns of the first mold 300a contacts the first metal film 111. Meanwhile, the portion of the first ER layer 190a that corresponds to the recess patterns of the first mold 300a, and the portion of the first ER layer 190a that has been moved from the embossed patterns of the first mold 300a are added to the recess patterns of the first mold 300a to form a first ER pattern 190b, as illustrated in FIGS. 5A and 5B.

The patterns of the first mold 300a can have a thickness at least greater than that of the first ER layer 190a. Therefore, the portion of the first ER layer 190a that corresponds to the recess patterns of the first mold 300a, and the portion of the first ER layer 190a that has been removed from the embossed portion of the first mold 300a are added to the recess patterns of the first mold 300a, so that the first ER pattern 190b can be formed. Then, the first ER pattern 190b is hardened from liquid to solid. A hardening process may be a thermal hardening process or a light hardening process.

After the hardening process is completed, the first mold 300a is detached from the substrate 110.

Through the above process, the first ER pattern 190b is formed on the substrate 110.

Figure 6A:
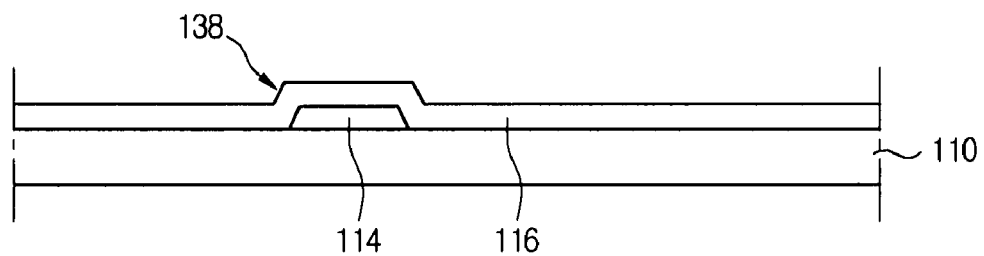
Figure 6B:
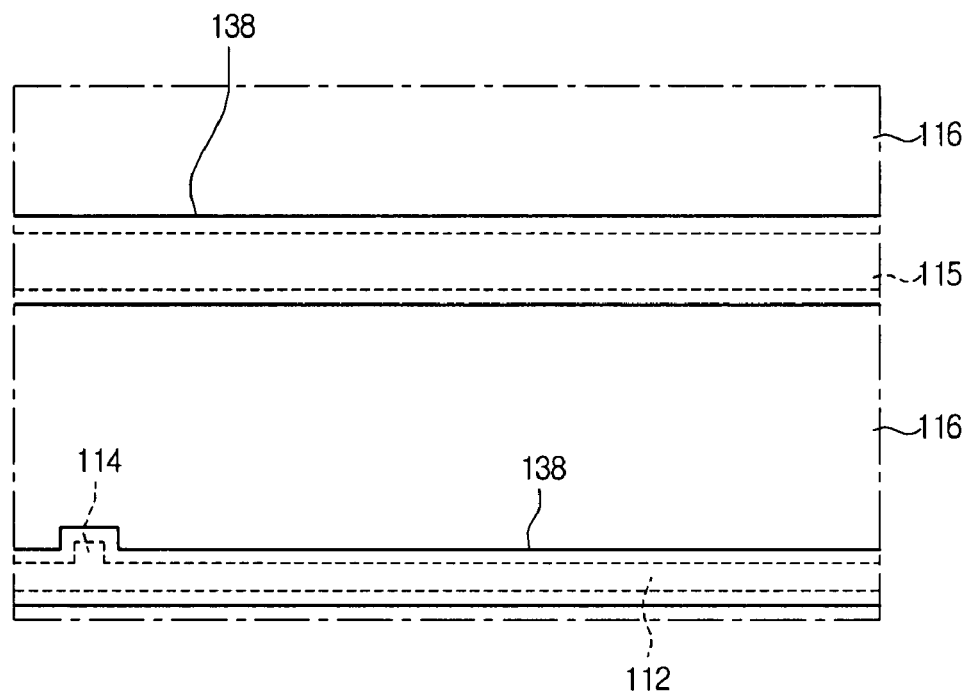

Referring to FIGS. 6A and 6B, the first metal film 111 is patterned using the first ER pattern 190b as a mask to form a gate line 112, a gate electrode 114 extending from the gate line 112, and a common line 115 parallel to the gate line 112. After the patterning, the first ER pattern 190b is stripped.

A gate insulating layer 116 is formed on the substrate 110, including the gate line 112. The gate insulating layer 116 can be formed of an inorganic insulating material, such as SiN, or an organic insulating material, such as BCB.

The gate insulating layer 116 can be formed to have a constant thickness. At this point, the gate insulating layer 116 has a first height difference 138 caused by the gate line 112, the gate electrode 114, and the common line 115.

In the case where the first height difference 138 is generated, it is difficult to perform the IPP to achieve the desired patterns. That is, the IPP can be used on a somewhat planar surface. Therefore, the first height difference 138 should be compensated for so that a planar surface is presented for a subsequent IPP.

Figure 7A:
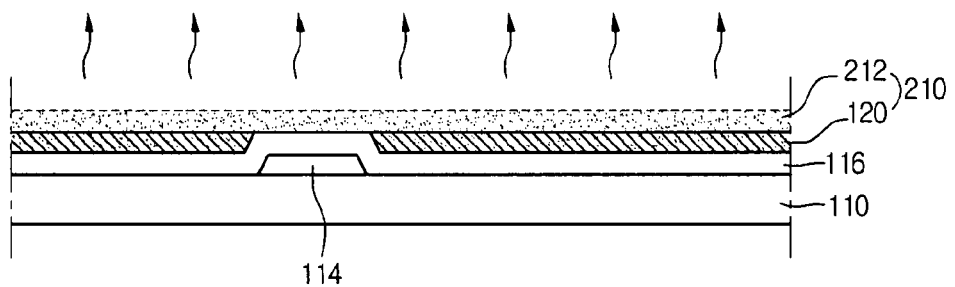
Figure 7B:
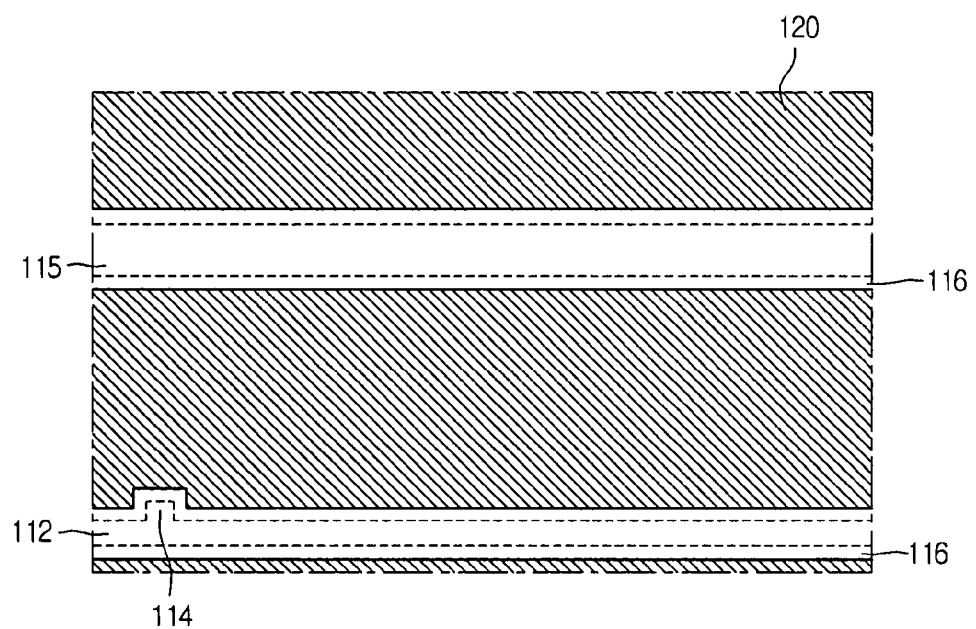

Referring to FIGS. 7A and 7B, a first planarization layer 210 is formed on the gate insulating layer 116 to compensate for the first height difference 138. The first planarization layer 210 can be formed of the same material as the gate insulating layer 116 or a material different from the gate insulating layer 116. The first planarization layer 210 is preferably made of a low dielectric insulating material. Parasitic capacitance can be reduced by forming the first planarization layer 210 using low dielectric material. Since the first planarization layer 210 is formed on the entire surface of the gate insulating layer 116, the first planarization layer 210 is also formed on portions of the gate insulating layer 116 that corresponds to the lines 112, 114 and 115, so that the gate insulating layer 116 is not exposed. Then, an ashing process is performed to remove the portion 212 of the first planarization layer 210 that is located on the higher portions of the gate insulating layer 116 that correspond to the lines 112, 114, and 115 so that the portions of the gate insulating layer 116 is exposed. Through this process, a first plane layer 120 having the same height as that of the gate insulating layer 116 is formed. Since the gate insulating layer 116 and the first plane layer 120 have the same height, the first height difference 138 is removed. Consequently, a plane having a uniform height is maintained by the portions of the gate insulating layer 116 that correspond to the lines 112, 114, and 115, and the first plane layer 120.

Figure 8A:
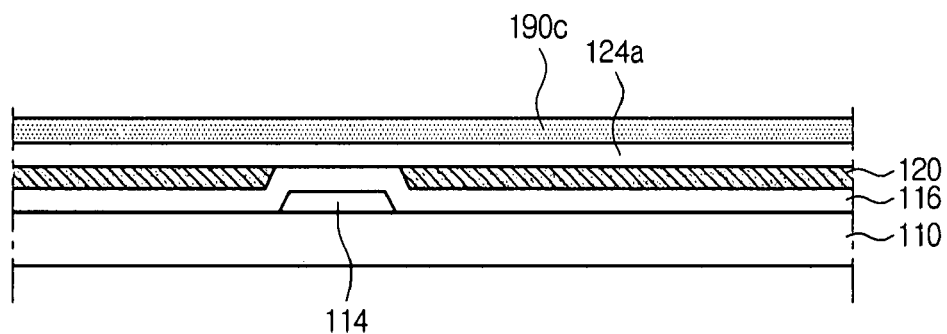
Figure 8B:
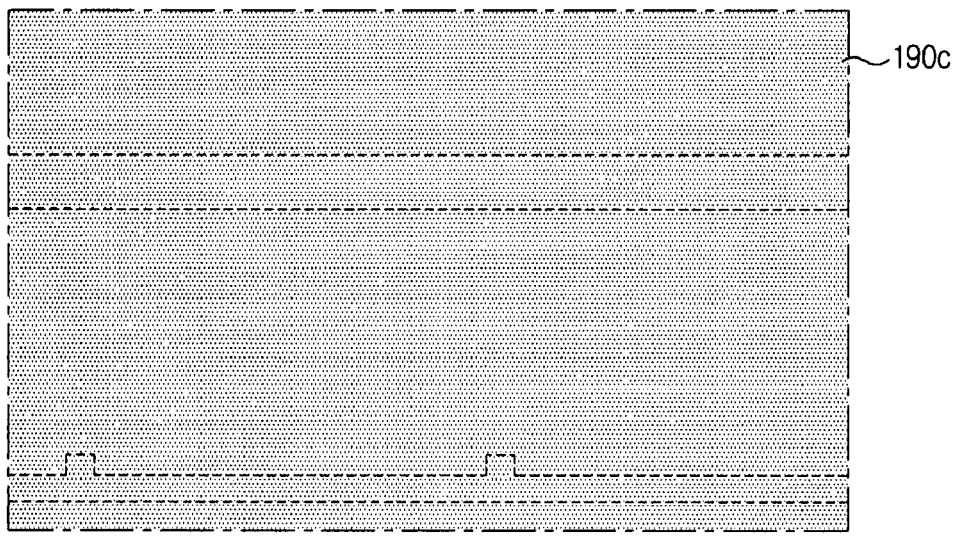

Referring to FIGS. 8A and 8B, a semiconductor material 124a is formed on the substrate 110, including the first plane layer 120, and an etching resist material is coated thereon to form a second ER layer 190c. The second ER layer 190c can be formed of the same material as that of the first ER layer 190a. The semiconductor material 124a can include an active material, which is amorphous silicon or polysilicon, and an ohmic contact material containing doped amorphous silicon or doped polysilicon.

The second ER layer 190c serves as a mask and can be formed from one of a group including polyethylene glycol, hexandiol diacylate, and 1,4-butanediol diglycidyl ether.

Figure 9A:
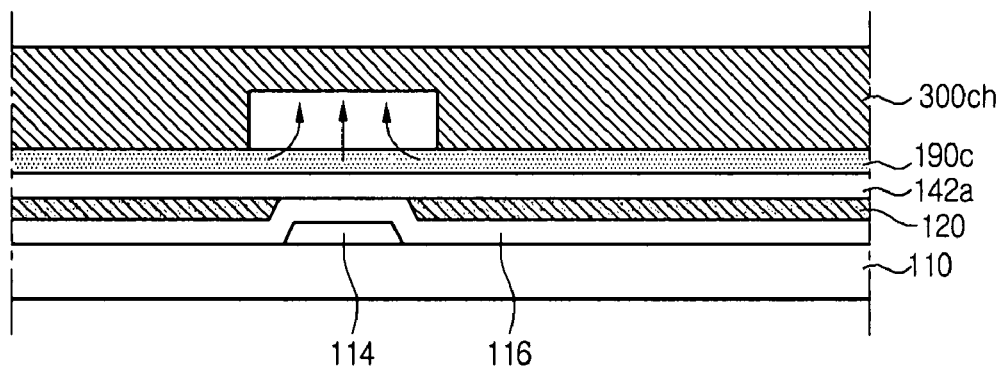
Figure 9B:
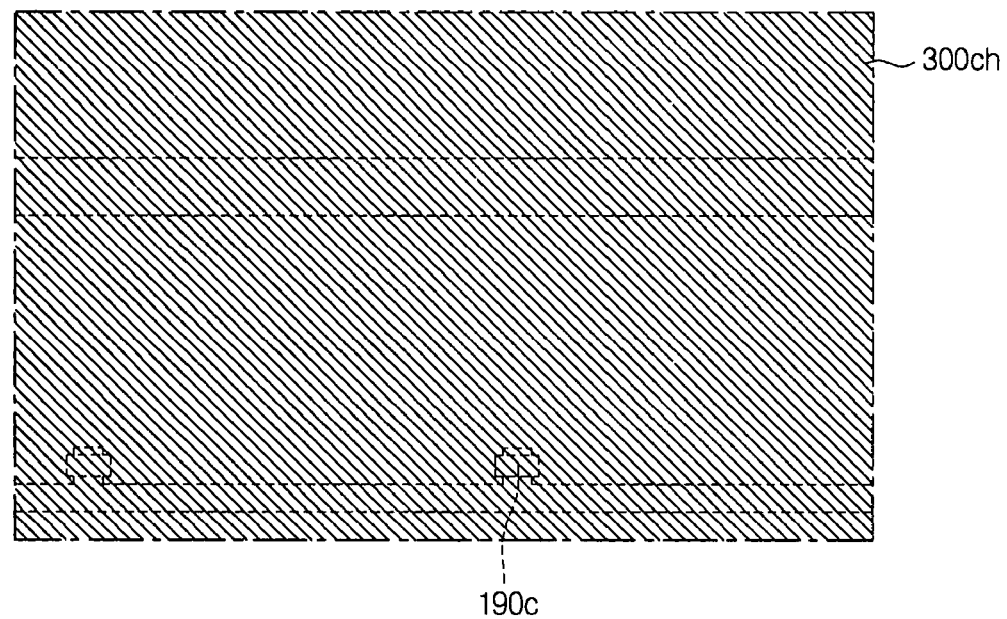

Referring to FIGS. 9A and 9B, a second mold 300ch having embossed/recess patterns is disposed on the second ER layer 190c. The second mold 300ch is manufactured from a master mold, and can be easily understood from the above-described method for manufacturing the first mold 300a. When the second mold 300ch contacts the second ER layer 190c, a portion of the second ER layer 190c that corresponds to the embossed pattern of the second mold 300ch is moved to the recess pattern of the second mold 300ch by the above-described repulsive force and capillary force, so that a second ER pattern 190ch is formed.

Figure 10A:
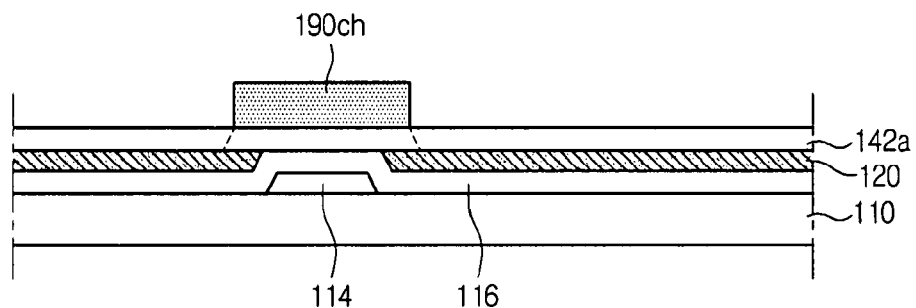
Figure 10B:
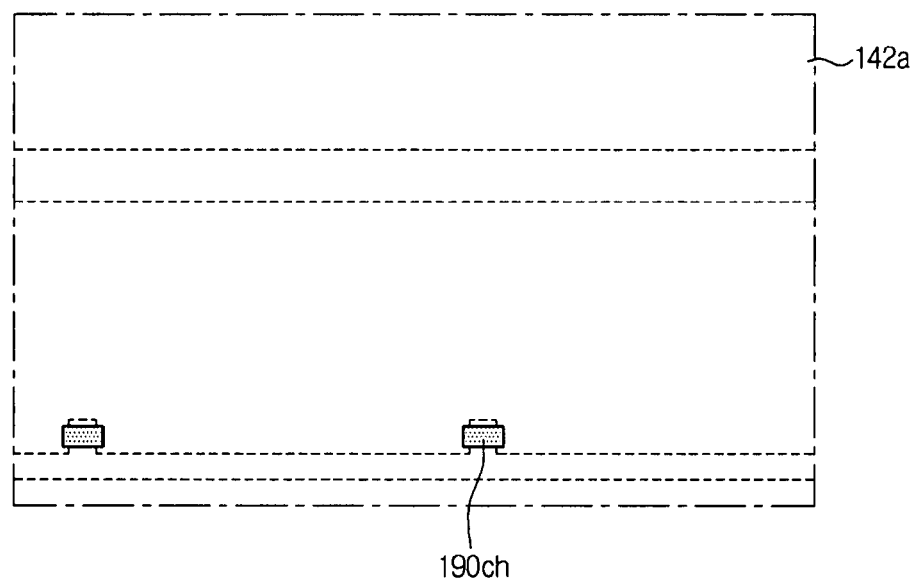

After that, referring to FIGS. 10A and 10B, the second ER pattern 190ch is hardened using thermal hardening process or light hardening process, and then the second mold 300ch is detached from the substrate 110.

The thickness of the pattern of the second mold 300ch can be at least greater than the thickness of the second ER layer 190c. Therefore, the portion of the second ER layer 190c that corresponds to the recess pattern of the second mold 300ch, and the portion of the second ER layer 190c that has been moved from the embossed portion of the second mold 300ch are added to the recess pattern of the second mold 300ch, so that the second ER pattern 190ch can be formed.

Figure 11A:
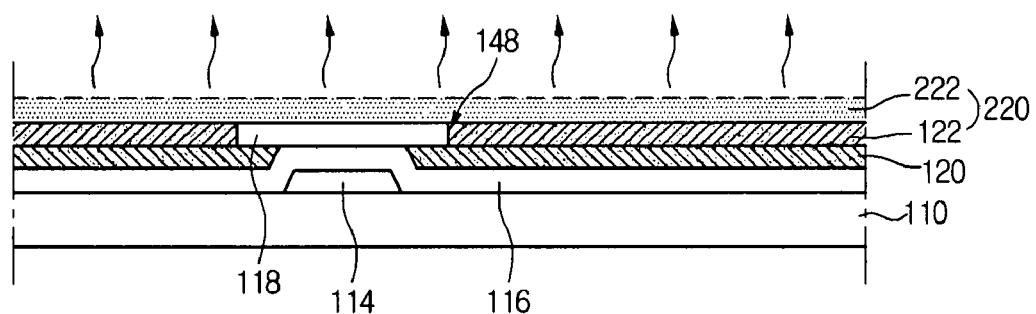
Figure 11B:
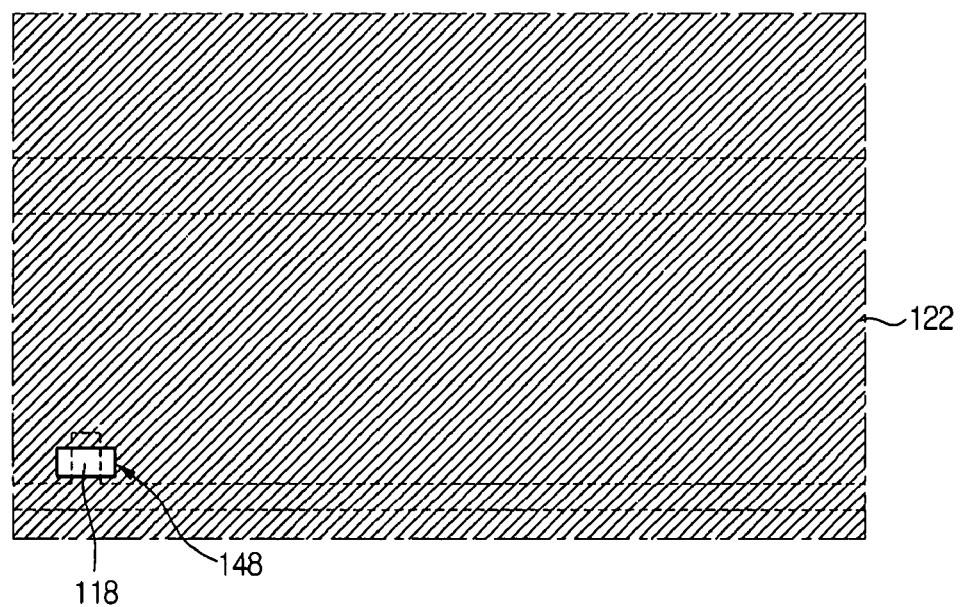

Referring to FIGS. 11A and 11B, a semiconductor layer 118 is formed by performing an etching process using the second ER pattern 190ch as an etch mask to pattern the semiconductor material 142a. The semiconductor layer 118 can be formed on a portion of the gate insulating layer 116 that corresponds to the gate electrode 114. After the patterning, the second ER pattern 190ch is stripped. A second height difference 148 is generated by the semiconductor layer 118. Therefore, a second planarization layer 220 is formed on the first plane layer 120 including the semiconductor layer 118 to compensate for the second height difference 148.

The second planarization layer 220 can be formed of an inorganic insulating material, such as SiN, or an organic insulating material, such as benzocyclobutene (BCB). The second planarization layer 220 is preferably made of low dielectric insulating material. Parasitic capacitance can be reduced by forming the second planarization layer 220 using low dielectric material. Since the second planarization layer 220 is formed on the semiconductor layer 118, the semiconductor layer 118 is not exposed. Generally, a source electrode and a drain electrode should be formed on the semiconductor layer 118 to contact thereto, but the source electrode and the drain electrode cannot be directly formed on contact the semiconductor layer 118 to contact thereto due to the second planarization layer 220.

Then, an ashing process is performed to remove a portion 222 of the second planarization layer 220 on the semiconductor layer 118 so that the semiconductor layer 118 is exposed to form a second plane layer 122 having the same height as that of the semiconductor layer 118. Since the semiconductor layer 118 and the second plane layer 122 have the same height, the second height difference 148 caused by the semiconductor layer 118 can be removed. Consequently, a plane having a uniform height is maintained by the semiconductor layer 118 and the second plane layer 122. The second plane layer 122 can be formed of the same material as the first plane layer 120 or a material different from the first plane layer 120.

Figure 12A:
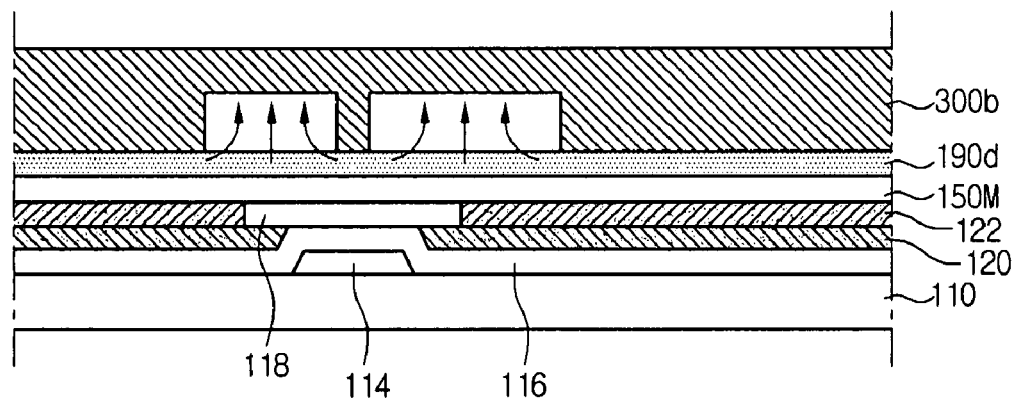
Figure 12B:
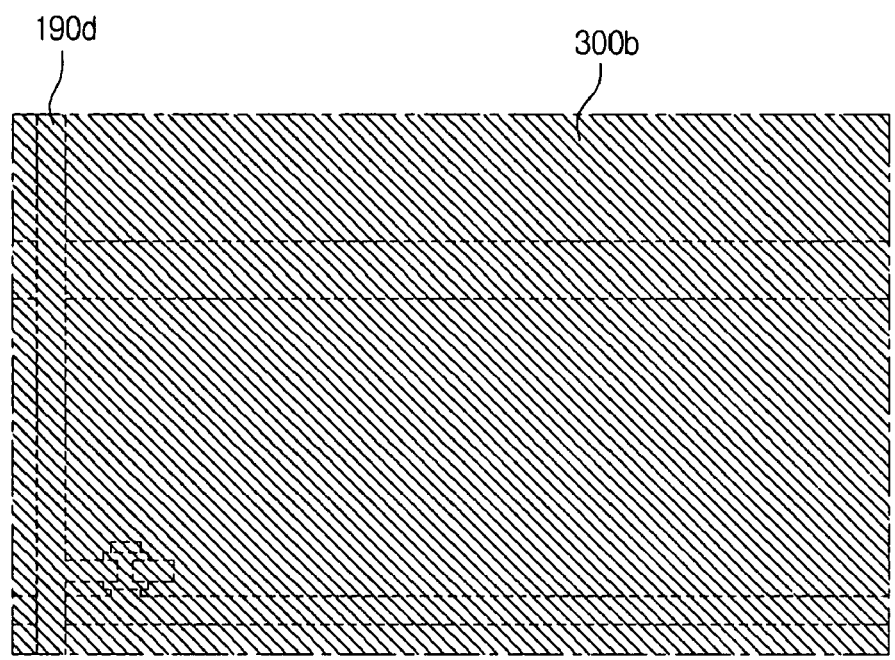

Referring to FIGS. 12A and 12B, a second metal film 150M is formed on the substrate 110 including the second plane layer 122, and an etching resist material is coated thereon to form a third ER layer 190d. The second metal film 150M can be formed of metal having conductivity. The second metal film 150M can be deposited using sputtering or CVD.

The third ER layer 190d serves as a mask and can be formed from one of a group including polyethylene glycol, hexandiol diacylate, and 1,4-butanediol diglycidyl ether.

Subsequently, a third mold 300b having embossed/recess patterns is disposed on the third ER layer 190d. The third mold 300b is manufactured from a master mold and can be easily understood from the above-described method for manufacturing the first mold 300a. When the third mold 300b contacts the third ER layer 190d, a portion of the third ER layer 190d that corresponds to the embossed pattern of the third mold 300b is moved to the recess pattern of the third mold 300b by the above-described repulsive force and capillary force, so that a third ER pattern 190e is formed.

Figure 13A:
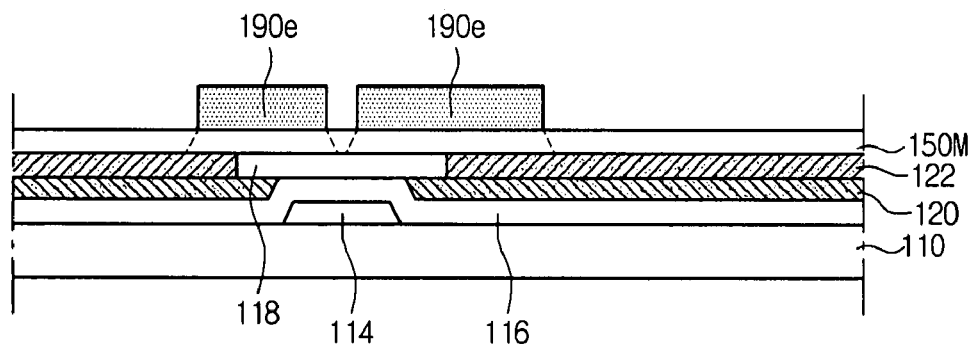
Figure 13B:
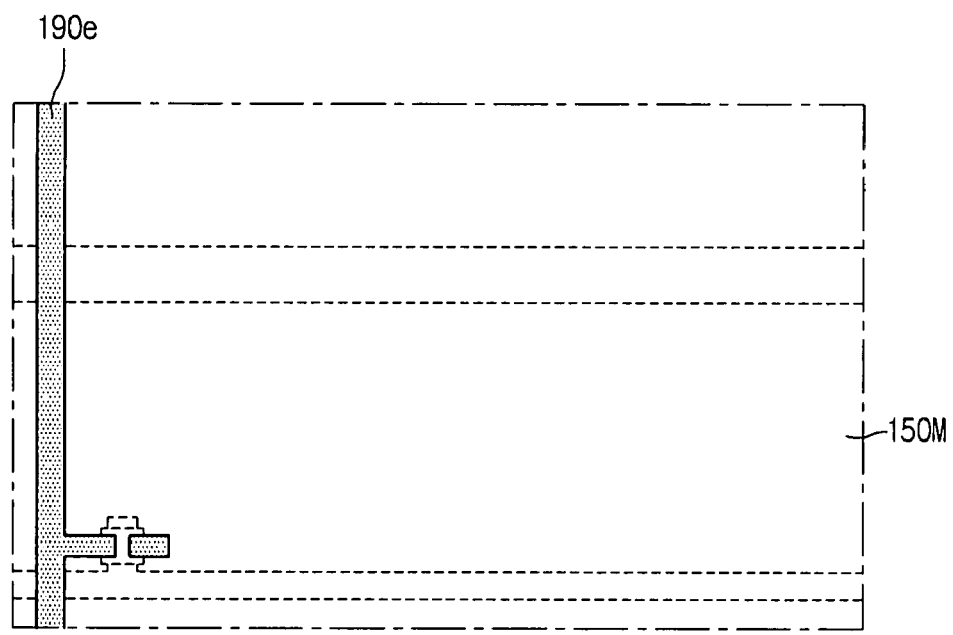

Then, referring to FIGS. 13A and 13B, after the third ER pattern 190e is hardened using thermal hardening process or light hardening process, the third mold 300b is detached from the substrate 110. The thickness of the pattern of the third mold 300b can be at least greater than the thickness of the third ER layer 190d. Therefore, the portion of the third ER layer 190d that corresponds to the recess pattern of the third mold 300b, and the portion of the third ER layer 190d that has been moved from the embossed portion of the third mold 300b are added to the recess pattern of the third mold 300b, so that the third ER pattern 190e can be formed.

Figure 14A:
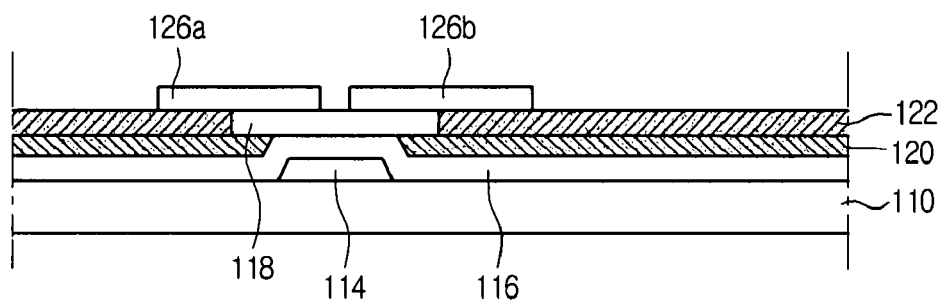
Figure 14B:
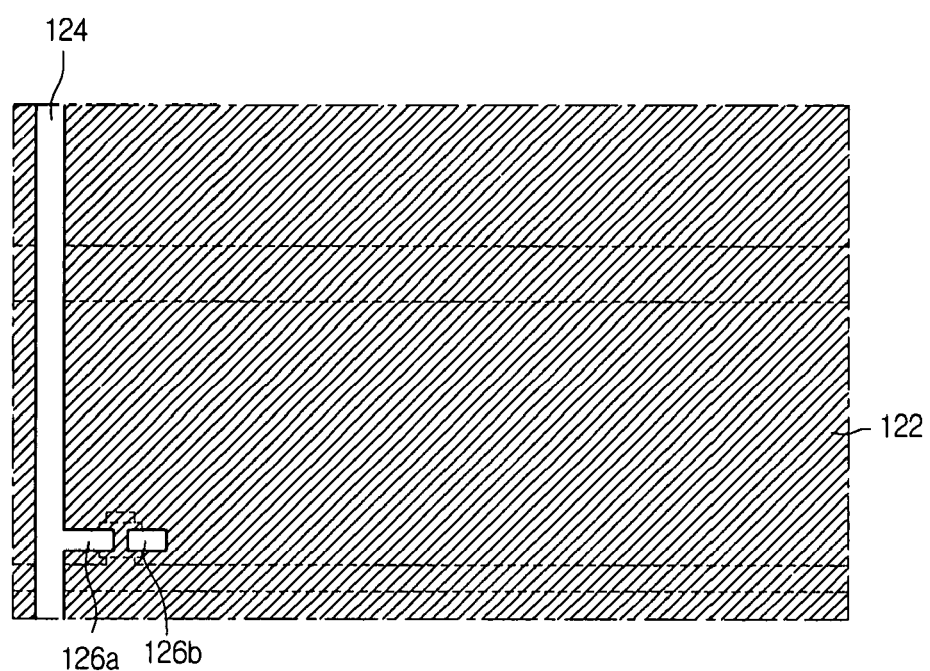

The second metal film 150M is patterned using the third ER pattern 190e as a mask to form a data line 124 crossing a gate line 112, a source electrode 126a extending from a data line 124, and a drain electrode 126b apart from the source electrode 126a as illustrated in FIGS. 14A and 14B. Then, the third ER pattern 190e is stripped.

Through the above process, a thin film transistor (TFT) including the gate electrode 114, the semiconductor layer 118, the source electrode 126a, and the drain electrode 126b can be formed.

Figure 15A:
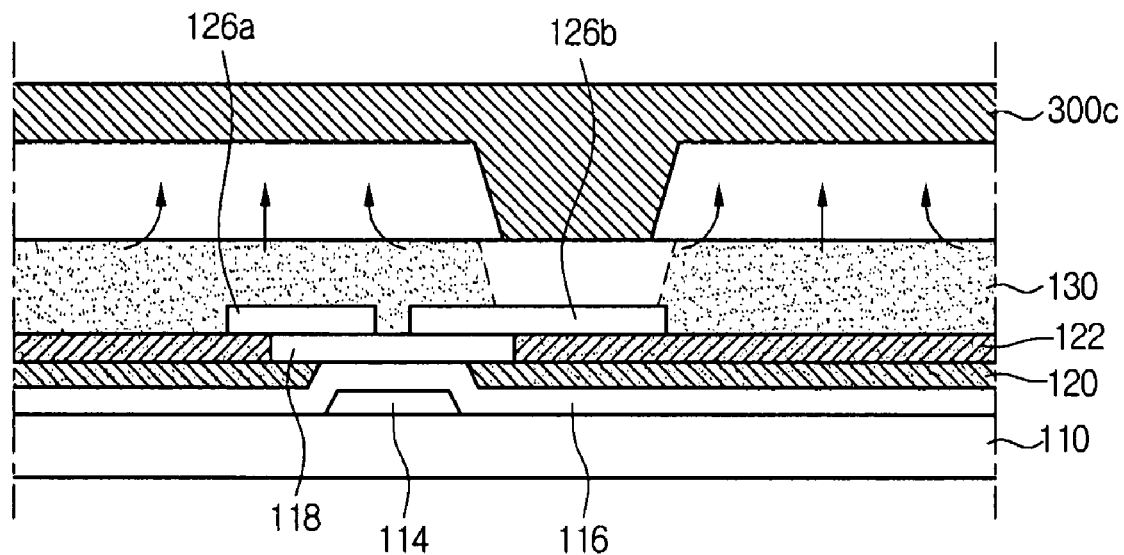
Figure 15B:
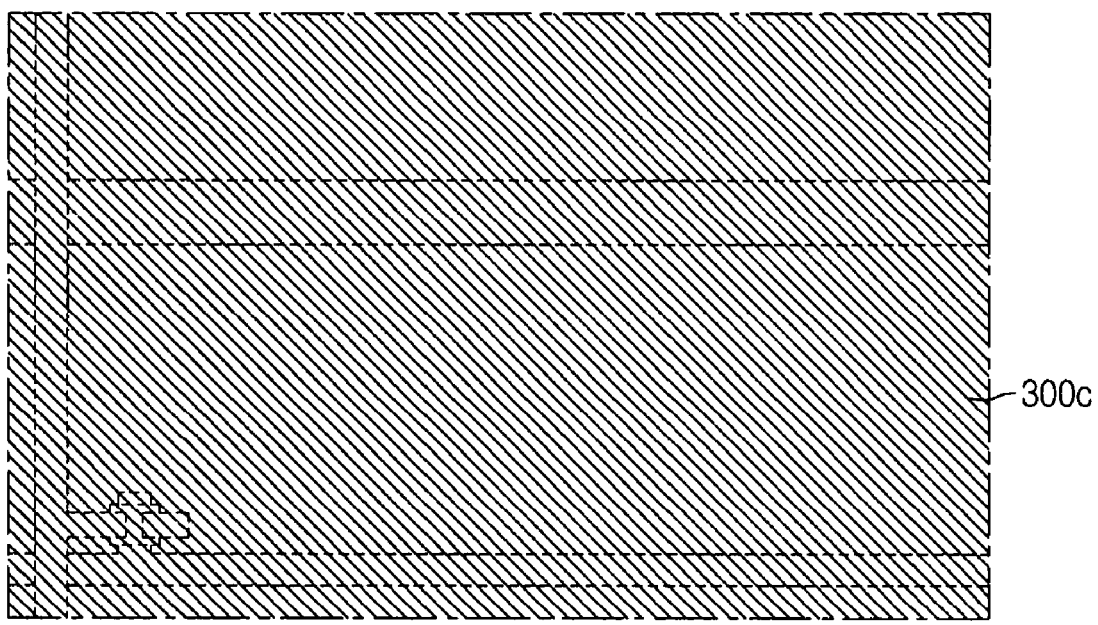

Referring to FIGS. 15A and 15B, a passivation layer 130 is formed on the substrate 110 including the data line 124. The passivation layer 130 can be formed of an inorganic insulating material, such as SiN, or an organic insulating material, such as BCB. Since the passivation layer 130 is formed thick generally, the upper surface of the passivation layer 130 obtains a uniform plane. In other words, the passivation layer 130 does not have a height difference caused by the data line 124, the source electrode 126a, and the drain electrode 126b. Therefore, no separate plane layer is required to compensate for the height difference.

Figure 16A:
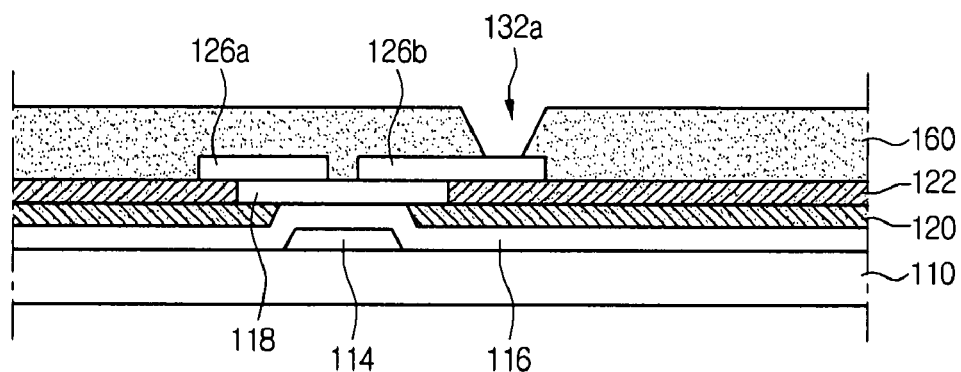
Figure 16B:
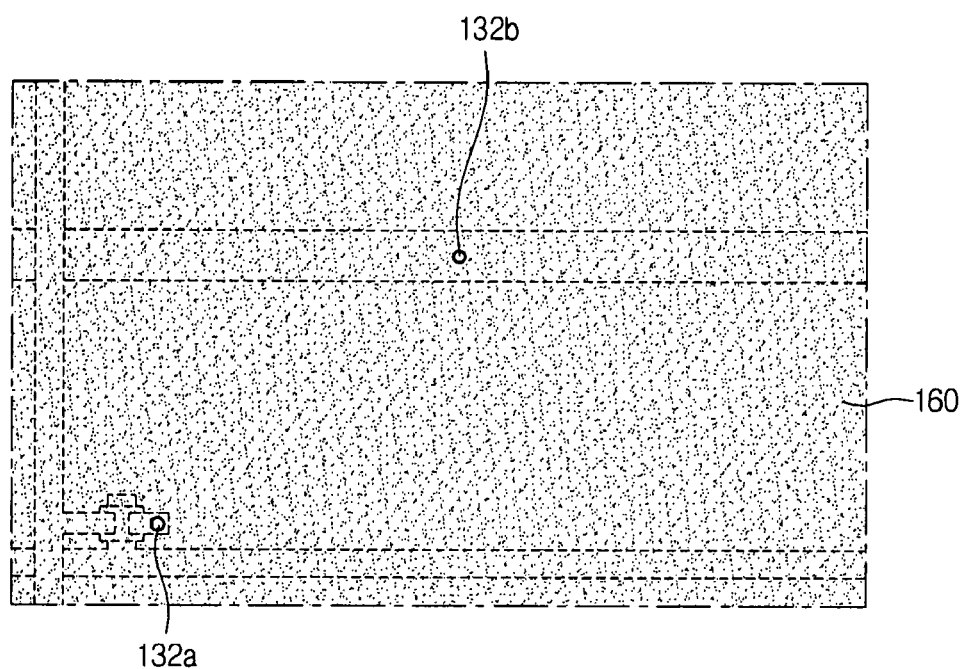

When a fourth mold 300c having embossed/recess patterns contacts the passivation layer 130, a portion of the passivation layer 130 that corresponds to the recess pattern of the fourth mold 300c is moved to the recess pattern of the fourth mold 300c, so that the embossed pattern of the fourth mold 300c contacts the upper surface of the drain electrode 126b or the common line 115. In other words, a portion of the passivation layer that corresponds to the embossed pattern of the fourth mold 300c is completed removed, so that a first contact hole 132a which the drain electrode 126b is exposed and the second contact hole 132b which the common line 115 is exposed are formed as illustrated in FIGS. 16A and 16B.

Since the passivation layer 130 is formed of an organic or inorganic material, the first contact hole 132a can be formed in the passivation layer 130 using the fourth mold 300c without forming a separate ER pattern. At this time, using the fourth mold 300c, a hole portion can be form in a portion of the passivation layer 130 corresponding to the common line 115.

Next, by performing a dry etching process, the first and second plane layer 120 and 122 are patterned to expose the common line 115 through the hole portion. Thus, a second contact hole 132b can be formed.

Then, the passivation layer 130 is hardened using thermal hardening process or light hardening process, and the fourth mold 300c is detached from the passivation layer 130.

Figure 17A:
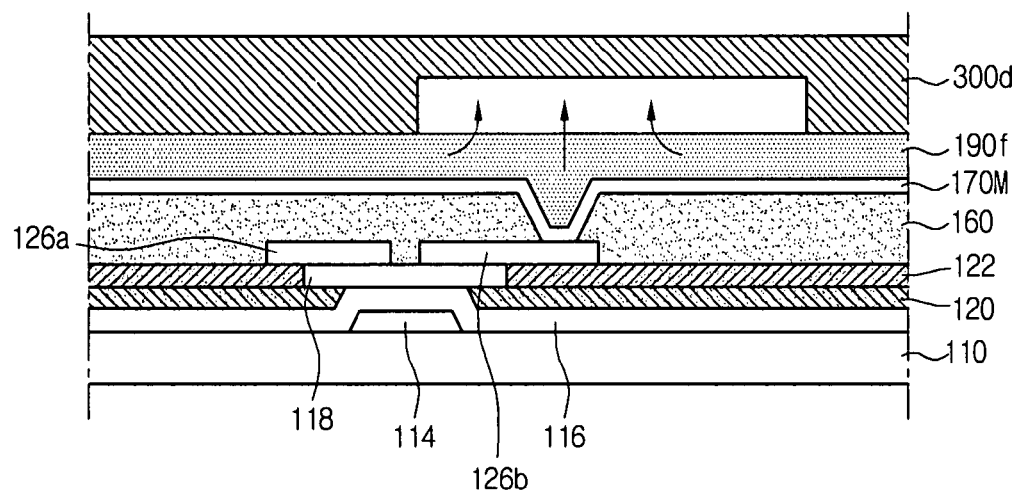
Figure 17B:
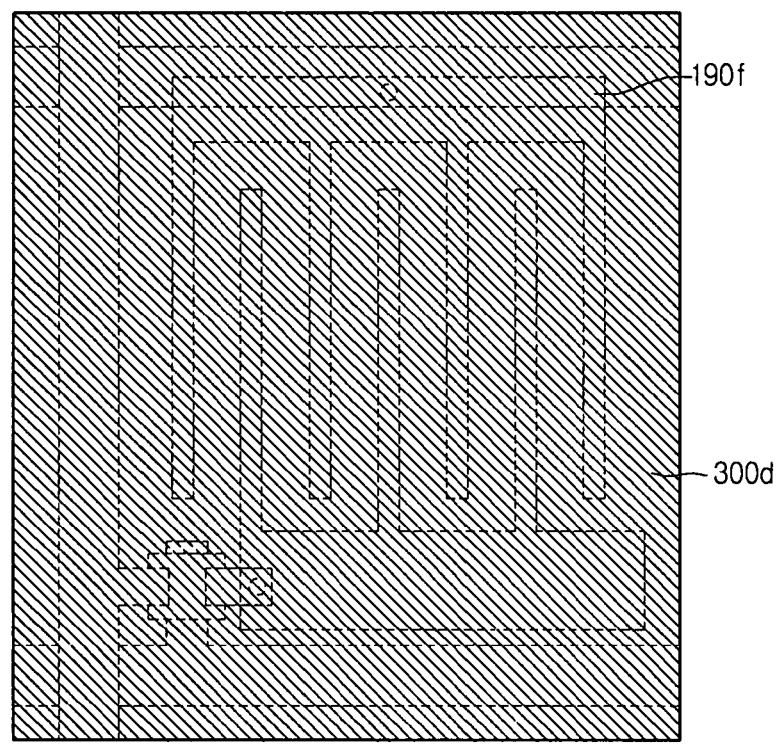
Figure 18A:
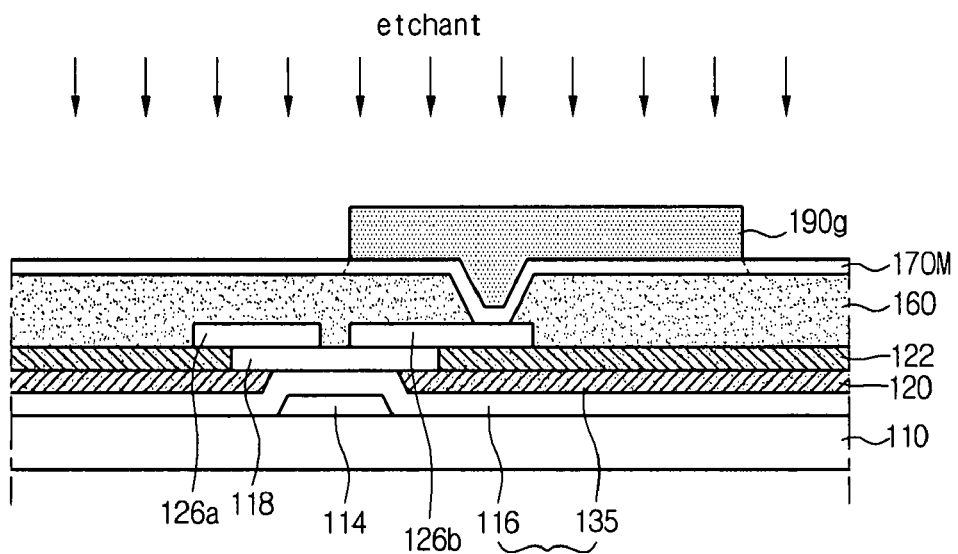
Figure 18B:
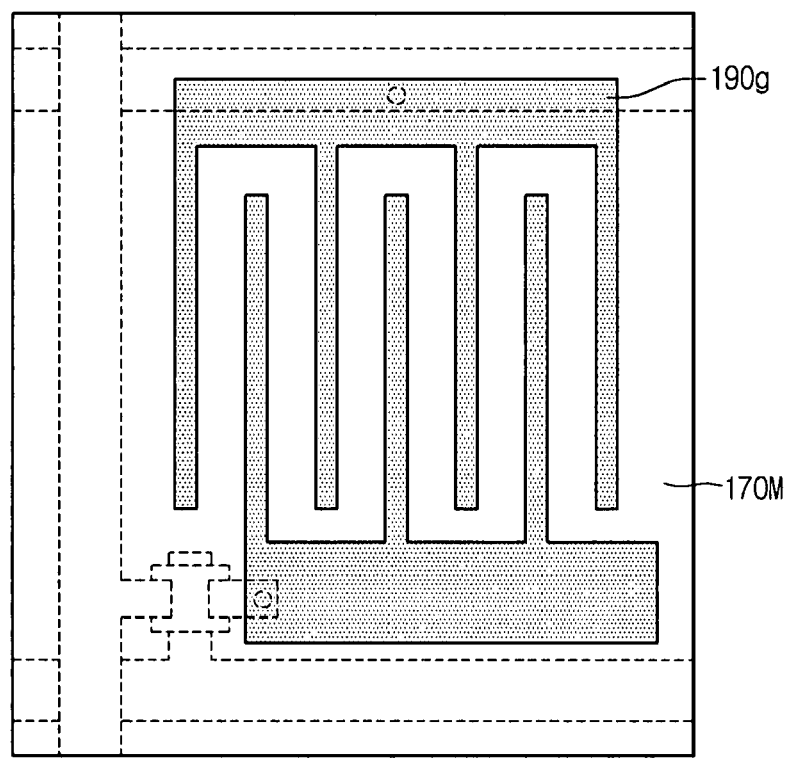

Referring to FIGS. 17A and 17B, a transparent conductive film 170M is formed on the passivation layer 130. The transparent conductive film 170M can be indium tin oxide (ITO) or indium zinc oxide (IZO).

An etching resist material is coated on the transparent conductive film 170M to form a fourth ER layer 190f to serve as a mask. The fourth ER layer 190f can be formed from one of a group of materials including polyethylene glycol, hexandiol diacylate, and 1,4-butanediol diglycidyl ether.

When the fifth mold 300d having embossed/recess patterns is disposed on the fourth ER layer 190f, a portion of the fourth ER layer 190f that corresponds to the embossed pattern of the fifth mold 300d is moved to the recess pattern of the fifth mold 300d by the above-described repulsive force and capillary force, so that a fourth ER pattern 190g is formed. Then, referring to FIGS. 18A and 18B, the fourth ER pattern 190g is hardened using thermal hardening process or light hardening process, and then the fifth mold 300d is detached from the substrate 110.

The thickness of the pattern of the fifth mold 300d can be at least greater than the thickness of the fourth ER layer 190f. Therefore, the portion of the fourth ER layer 190f that corresponds to the recess pattern of the fifth mold 300d, and the portion of the fourth ER layer 190f that has been moved from the embossed portion of the fifth mold 300d are added to the recess pattern of the fifth mold 300d, so that the fourth ER pattern 190g can be formed.

Figure 19A:
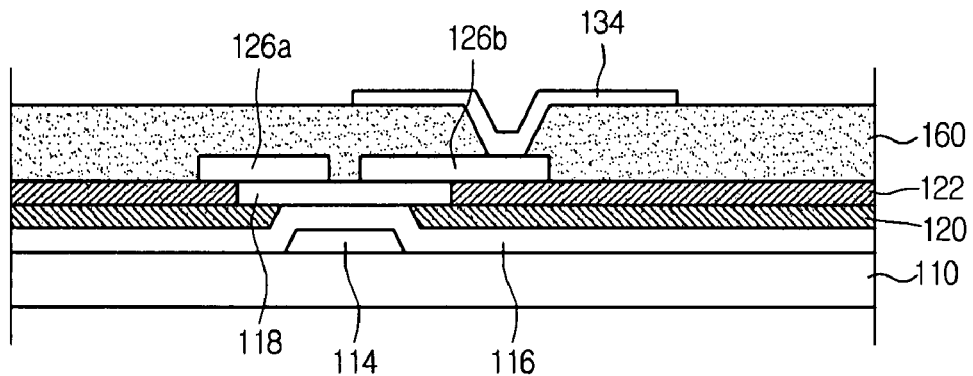
Figure 19B:
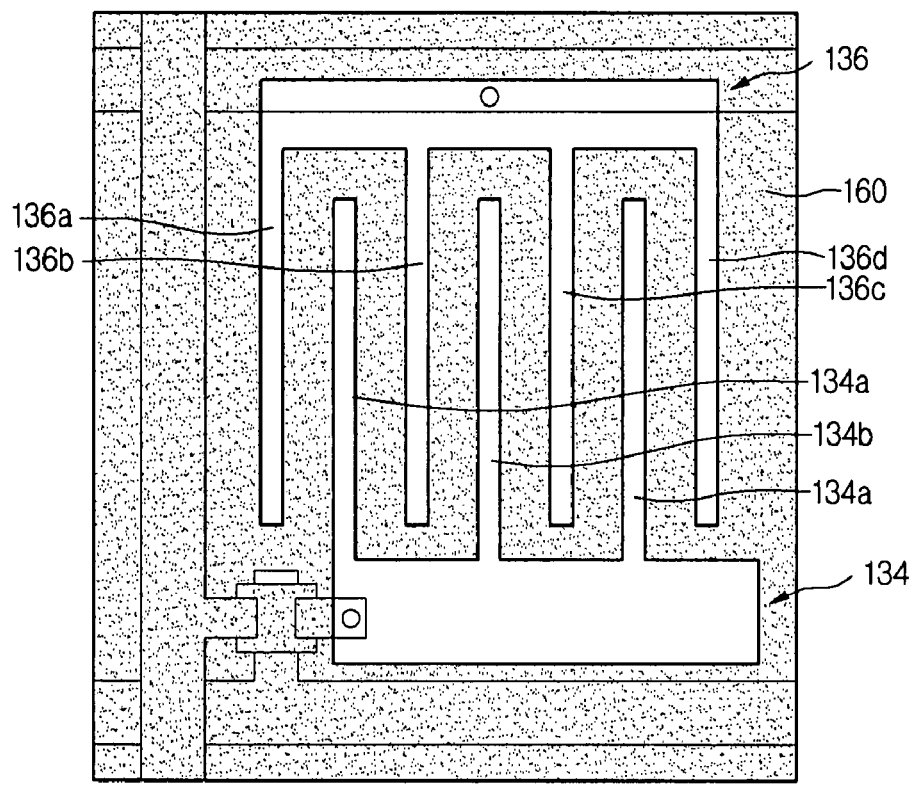

Subsequently, the transparent conductive film 170M is patterned using the fourth ER pattern 190g as an etch mask to form a pixel electrode 134 electrically connected to the drain electrode 126b via the first contact hole 132a, a plurality of pixel electrode bars 134a, 134b, and 134c extending from the pixel electrode 134, a common electrode 136 electrically connected to the common line 115 via the second contact hole 132b, and a plurality of common electrode bars 136a, 136b, 136c, and 136d extending from the common electrode 136 as illustrated in FIGS. 19A and 19B. After the patterning, the fourth ER pattern 190g is stripped. The pixel electrode bars 134a, 134b, and 134c, and the common electrode bars 136a, 136b, 136c, and 136d can be alternately formed.

According to embodiments of the present invention, an ER pattern is precisely formed using a mold, and a desired pattern can be precisely formed using the ER pattern. On the other hand, in the case where a pattern is formed using the related art photolithography, error is generated at a photoresist pattern due to diffraction of light, which results in imprecise pattern. According to embodiments of the present invention, since a pattern is directly transferred to the substrate using a mold to form an ER pattern, a more precise ER pattern can be formed and a high resolution pattern can be formed.

Also, according to embodiments of the present invention, a mold having embossed/recess patterns is easily manufactured from a master mold unlike the related art photolithography requiring an expensive exposure equipment, and an ER pattern is formed using this mold, so that a process costs can be remarkably reduced. Furthermore, according to embodiments of the present invention, a single process using a mold is used for forming an ER pattern while the photolithography including at least an exposure process and a development process is used for forming a photoresist pattern in a related art. Therefore, the number of processes is reduced and simplified.

Figure 20:
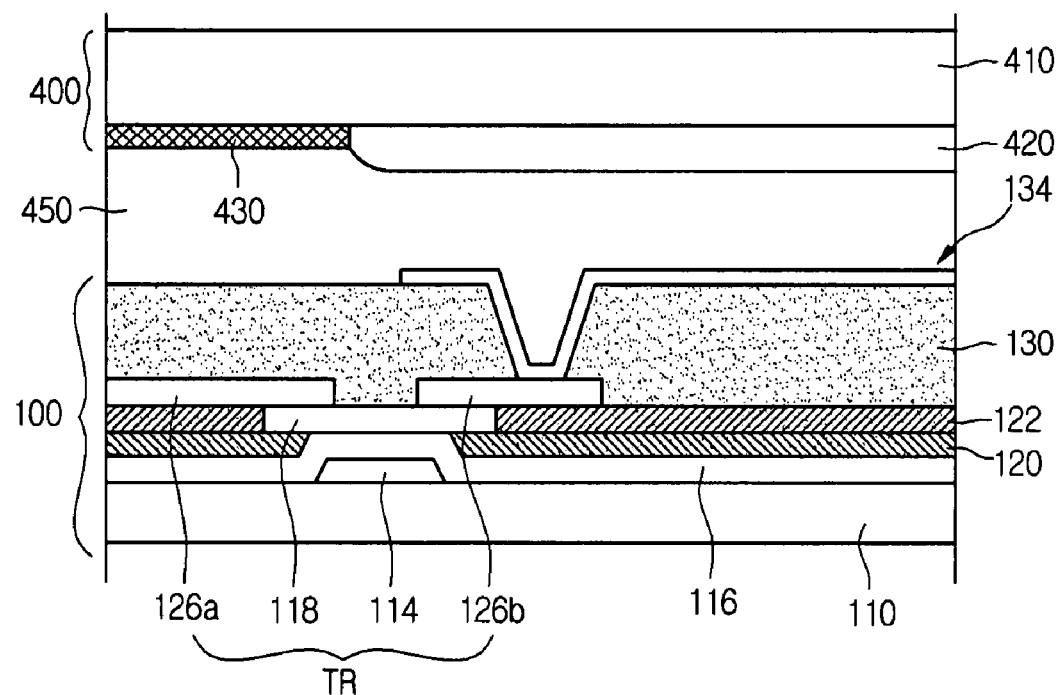
FIG. 20 is a cross-sectional view of a liquid crystal display device according to an embodiment of the invention.

FIG. 20 is a cross-sectional view of an LCD device according to an embodiment of the present invention. As shown in FIG. 20, the LCD device includes an array substrate 100, a color filter substrate 400 facing the array substrate 100, and a liquid crystal (LC) layer 450 interposed between the array substrate 100 and the color filter substrate 400. Since the array substrate 100 can be manufactured through the processes illustrated in FIGS. 3A and 19B, detailed description thereof will be omitted.

The color filter substrate 400 includes a color filter layer 420 and a black matrix (BM) layer 430. The color filter layer 420 includes color filters formed on pixel regions, respectively. The BM layer 430 absorbs and blocks light passing between the color filters.

The array substrate 100 and the color filter substrate 400 are attached to each other using a seal pattern, and the liquid crystal (LC) layer 450 is interposed between the array substrate 100 and the color filter substrate 400, so that the LCD device can be finally manufactured. This process is limited to an LC injection method. In the case of an LC dropping method, an LC layer is dropped on one of the array substrate 100 and the color filter substrate 400, and then the array substrate 100 is attached to the color filter substrate 400 using a seal pattern.

According embodiments of the present invention, an array substrate having the more precise pattern, and an LCD device having the same can be manufactured using the IPP. Since the photolithography is not used, process costs can be remarkably reduced and the number of processes is reduced and simplified. Thus, a high resolution pattern can be obtained and yield can be improved by directly transferring a pattern of the mold to a substrate.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. An array substrate, comprising:
   a gate line disposed along a first direction on a substrate;
   a gate electrode extending from the gate line;
   a gate insulating layer over the substrate, including the gate line;
   a first plane layer on first portions of the gate insulating layer;
   a semiconductor layer on second portions of the gate insulating layer and on the first plane layer;
   a second plane layer over the first plane layer;
   a data line;
   a source electrode and a drain electrode on the semiconductor layer and on the second plane layer, the source electrode extending from the data line;
   a passivation layer on the second plane layer, the source electrode, the drain electrode and the semiconductor layer; and
   a pixel electrode on the passivation layer, the pixel electrode electrically connected to the drain electrode via a first contact hole.

2. The array substrate according to claim 1, wherein the first plane layer has a top surface at a same height as an upper surface of the first portions of the gate insulating layer corresponding to the gate line.

3. The array substrate according to claim 1, wherein the second plane layer has a top surface at a same height as an upper surface of the semiconductor layer.

4. The array substrate according to claim 1, wherein the data line is disposed on the second plane layer along a second direction crossing the first direction.

5. The array substrate according to claim 1, wherein the semiconductor layer overlaps onto an upper surface of the first plane layer.

6. The array substrate according to claim 1, wherein the first and second plane layers include insulating materials, respectively.

7. The array substrate according to claim 1, wherein the material of the first plane layer is the same as or different than that of the gate insulating layer.

8. The array substrate according to claim 1, wherein the material of the second plane layer is the same as or different than that of the gate insulating layer.

9. The array substrate according to claim 1, wherein the pixel electrode includes a plurality of pixel electrode protrusions, the pixel electrodes protrusions extending from the pixel electrode.

10. The array substrate according to claim 1, further comprising a common line disposed parallel to the gate line; and
    a common electrode on the passivation layer, the common electrode electrically connected to the common line via a second contact hole.

11. The array substrate according to claim 10, wherein the common electrode includes a plurality of common electrode protrusions, the common electrode protrusions extending from the common electrode.

12. The array substrate according to claim 1, wherein the first plane layer is formed of one of an organic insulating material and an inorganic insulating material.

13. The array substrate according to claim 1, wherein the second plane layer is formed of one of an organic insulating material and an inorganic insulating material.

14. A liquid crystal display device, comprising:
    a color filter substrate;
    an array substrate including:
       a gate line disposed along a first direction on a substrate;
       a gate electrode extending from the gate line;
       a gate insulating layer over the substrate, including the gate line;
       a first plane layer on first portions of the gate insulating layer;
       a semiconductor layer on second portions of the gate insulating layer and on the first plane layer;
       a second plane layer over the first plane layer;
       a data line;
       a source electrode and a drain electrode on the semiconductor layer and on the second plane layer, the source electrode extending from the data line;
       a passivation layer on the second plane layer, the source electrode, the drain electrode and the semiconductor layer; and
       a pixel electrode on the passivation layer, the pixel electrode electrically connected to the drain electrode via a first contact hole; and
    a liquid crystal layer between the color filter substrate and the array substrate.

* * * * *